(12) United States Patent
Zhao et al.

(10) Patent No.: US 10,943,553 B2
(45) Date of Patent: Mar. 9, 2021

(54) SHIFT REGISTER UNIT, GATE LINE DRIVING CIRCUIT AND DRIVING METHOD THEREOF (71) Applicants: BOE Technology Group Co., Ltd., Beijing (CN); Hefei Xinsheng Optoelectronics Technology Co., Ltd., Hefei (CN)

(72) Inventors: Jian Zhao, Beijing (CN); Peng Li, Beijing (CN); Huanyu Li, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 262 days.

(21) Appl. No.: 15/774,568

(22) PCT Filed: Sep. 22, 2017

(86) PCT No.: PCT/CN2017/102982
§ 371 (c)(1),
(2) Date: May 8, 2018

(87) PCT Pub. No.: WO2018/188275
PCT Pub. Date: Oct. 18, 2018

(65) Prior Publication Data
US 2020/0273417 A1 Aug. 27, 2020

(30) Foreign Application Priority Data
Apr. 12, 2017 (CN) .......................... 201710237053.9

(51) Int. Cl.
G09G 3/36 (2006.01)

(52) U.S. Cl.
CPC ......... *G09G 3/3677* (2013.01); *G09G 3/3614* (2013.01); *G09G 2310/0286* (2013.01); *G09G 2310/08* (2013.01)

(58) Field of Classification Search
CPC ... G09G 2310/0213; G09G 2310/0286; G09G 2310/08; G09G 2330/021; G09G 3/3677;
(Continued)

(56) References Cited

U.S. PATENT DOCUMENTS 3,859,655 A * 1/1975 Van Duuren ......... H04L 25/493
341/68
2007/0171172 A1 7/2007 Chang et al.
(Continued)

FOREIGN PATENT DOCUMENTS

CN 101609656 A 12/2009
CN 102012591 A 4/2011
(Continued)

OTHER PUBLICATIONS

Sep. 3, 2019—(CN) First Office Action Appn 201710237053.9 with English Translation.
(Continued)

*Primary Examiner* — Robert J Michaud
(74) *Attorney, Agent, or Firm* — Banner & Witcoff, Ltd.

(57) ABSTRACT

Disclosed are a shift register unit, a gate driving circuit and a driving method thereof, the shift register unit including: an input sub-circuit configured to provide a trigger signal received by the signal input terminal to the pull-up node; an output sub-circuit configured to output, to the signal output terminal, a pulse signal provided by the first clock signal terminal as a driving signal for scanning a gate line under control of the pull-up node; a reset sub-circuit configured to reset the pull-up node and the signal output terminal under control of the reset terminal; and an input selection sub-
(Continued)

circuit configured to select a trigger signal to be provided to the signal input terminal according to voltage levels at first to third control terminals.

18 Claims, 8 Drawing Sheets

(58) Field of Classification Search
CPC . G09G 3/3696; G09G 2330/028; G11C 19/28
See application file for complete search history.

(56) References Cited

U.S. PATENT DOCUMENTS

| | | |
|---|---|---|
| 2009/0315920 A1 | 12/2009 | Sakurai et al. |
| 2011/0057926 A1 | 3/2011 | Shang |
| 2011/0058640 A1* | 3/2011 | Shang .................. G11C 19/184 377/64 |
| 2015/0325190 A1 | 11/2015 | Cao |
| 2016/0240158 A1* | 8/2016 | Xu ......................... G11C 19/28 |
| 2018/0335814 A1 | 11/2018 | Shao et al. |

FOREIGN PATENT DOCUMENTS

| | | |
|---|---|---|
| CN | 102024500 A | 4/2011 |
| CN | 103928005 A | 7/2014 |
| CN | 106057147 A | 10/2016 |
| WO | 2018082268 A1 | 5/2018 |

OTHER PUBLICATIONS

Sep. 18, 2020—(EP) Extended European Search Report Appn 17863301.2.

* cited by examiner

SHIFT REGISTER UNIT, GATE LINE DRIVING CIRCUIT AND DRIVING METHOD THEREOF

The application is a U.S. National Phase Entry of International Application No. PCT/CN2017/102982 filed on Sep. 22, 2017, designating the United States of America and claiming priority to Chinese Patent Application No. 201710237053.9 filed on Apr. 12, 2017. The present application claims priority to and the benefit of the above-identified applications and the above-identified applications are incorporated by reference herein in their entirety.

TECHNICAL FIELD

The present disclosure relates to the field of display technology, and more particularly to a shift register unit, a gate driving circuit comprising a plurality of stages of the shift register units and a driving method thereof.

BACKGROUND

During displaying of a liquid crystal display panel including a pixel array, a gate driving circuit is used to generate gate line voltages for driving pixels on the display panel. The gate driving circuit outputs the gate line voltages and progressively scans respective pixels. In recent years, with continuous development of the amorphous silicon thin film technique, a gate driving circuit can be integrated into a thin film transistor array substrate to constitute GOA (Gate driver On Array) so as to drive the gate lines. When adopting GOA to drive, the GOA unit can be directly fabricated on the liquid crystal display panel, thus simplifying manufacturing process, reducing the product cost, and facilitating the realization of a narrow bezel.

Generally, GOA including a plurality of stages of shift register units can be used to provide switching signals for the gate lines in respective rows of the pixel array, thereby controlling a plurality of rows of gate lines to be turned on sequentially, and display data signals are inputted by data lines to pixels in the corresponding rows in the pixel array, thus forming grayscale voltages required for displaying respective grayscales of an image, so as to in turn display each frame of image.

In the GOA gate line driving circuit, the GOA unit in each stage transfers the scanning signal to the GOA unit in a next stage successively, thereby progressively driving corresponding connected gate lines, so that data signal inputting for pixel units can be completed using the data lines. In order to ensure that potential at the pull-up node in the GOA unit has an enough rise time, pull-up time will be designed to exceed the time required for charging one row of gate lines. Meanwhile, in order to meet high-resolution requirements of the current products, there is an overlap of turn-on between rows, so that while one gate line is being turned on, pixels on gate lines of a subsequent row can be pre-charged. Currently, there are various inversion modes for the display panel, for example, column inversion, 1 dot inversion, 2 dot inversion, 1+2 dot inversion, and the like. The existing GOA gate line driving circuits generally can pre-charge pixels with respect to only one inversion mode; if the inversion mode of the display panel is changed, it is impossible to achieve pre-charge effect for the new inversion mode. Therefore, it can probably result in different charging effects for different rows, cross strips and other undesirable phenomena may appear, which reduces quality of the display image.

SUMMARY

To this end, the present disclosure provides a shift register unit, a gate driving circuit comprising a plurality of stages of the shift register units and a driving method thereof.

According to an aspect of the present disclosure, there is provided a shift register unit, comprising: an input sub-circuit connected between a signal input terminal and a pull-up node and configured to provide a trigger signal received by the signal input terminal to the pull-up node; an output sub-circuit connected between the pull-up node, a signal output terminal and a first clock signal terminal, and configured to output, to the signal output terminal, a pulse signal provided by the first clock signal terminal as a driving signal for scanning a gate line under control of the pull-up node; a reset sub-circuit connected between a reset terminal, the pull-up node and the signal output terminal, and configured to reset the pull-up node and the signal output terminal under control of the reset terminal; and an input selection sub-circuit, an input terminal of the input selection sub-circuit being connected to a first trigger signal terminal, a second trigger signal terminal and a third trigger signal terminal, an output terminal of the input selection sub-circuit being connected to the signal input terminal of the shift register unit, and configured to select a trigger signal to be provided to the signal input terminal according to voltage levels at first to third control terminals.

According to another aspect of the present disclosure, there is provided a gate line driving circuit, comprising M stages of the shift register unit described above, wherein a signal output terminal of the shift register unit in each stage is connected to a gate line, and the shift register unit in each stage is configured as a Scanning shift register unit for driving a corresponding gate line; a signal output terminal of the Scanning shift register unit in an m-th stage is connected to input selection sub-circuits of the Scanning shift register units in an (m+1)-th stage, an (m+3)-th stage, and an (m+5)-th stage.

According to still another aspect of the present disclosure, there is provided a driving method applied to the gate line driving circuit described above, the driving method comprising: in a first inversion mode, inputting a first voltage level to a first control line and a second control line, and inputting a second voltage level to a third control line, so that Scanning GOA units in respective stages select a first trigger signal and a second trigger signal; wherein the Scanning GOA unit in a (k+2)-th stage pre-charges a (k+2)-th gate line connected thereto while the Scanning GOA unit in a k-th stage outputs a scanning signal to a k-th gate line connected thereto.

In the shift register unit, the gate line driving circuit and the driving method thereof provided by the present disclosure, the input selection sub-circuit set in the Scanning GOA unit in each stage can be controlled through corresponding control lines to select the trigger signals to be provided to the signal input terminal thereof, and thereby the number of pulse signal outputted by the Scanning GOA unit in each stage within one frame can be increased, so that for various inversion modes, while driving a corresponding gate line, the other gate lines can be pre-charged.

BRIEF DESCRIPTION OF THE DRAWINGS

In order to describe the technical solutions in the embodiments of the present disclosure more clearly, the accompanying drawings of the embodiments will be introduced briefly below. Apparently, the accompanying drawings in the following description relate to only some embodiments of the present disclosure, rather than limiting the scope of the present disclosure.

DETAILED DESCRIPTION OF THE EMBODIMENTS

Hereinafter, the technical solutions in the embodiments of the present disclosure will be described clearly and comprehensively in conjunction with the accompanying drawings. Obviously, these described embodiments are merely parts of the embodiments of the present disclosure, rather than all of the embodiments thereof. Other embodiments obtained by a person of ordinary skill in the art based on the embodiments of the present disclosure without paying creative effort all fall into the protection scope of the present disclosure.

Figure 1:
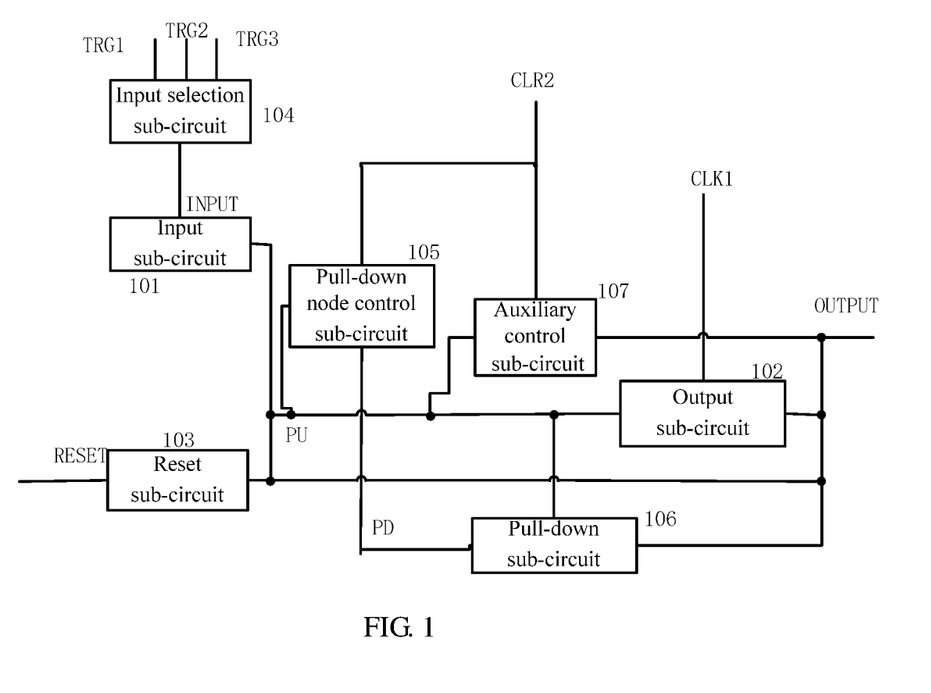
FIG. 1 illustrates a block diagram of a shift register unit according to an embodiment of the present disclosure.

FIG. 1 illustrates a block diagram of a shift register unit according to an embodiment of the present disclosure, as illustrated in FIG. 1, the shift register unit comprises: an input sub-circuit 101 connected between a signal input terminal INPUT and a pull-up node PU, and configured to provide a trigger signal received by the signal input terminal to the pull-up node; an output sub-circuit 102 connected between the pull-up node, a signal output terminal and a first clock signal terminal CLK1, and configured to output, to the signal output terminal, a pulse signal provided by the first clock signal terminal as a driving signal for scanning a gate line under control of the pull-up node; a reset sub-circuit 103 connected between a reset terminal, the pull-up node and the signal output terminal, and configured to reset the pull-up node and the signal output terminal under control of the reset terminal; and an input selection sub-circuit 104, an input terminal of the input selection sub-circuit being connected to a first trigger signal terminal TRG1, a second trigger signal terminal TRG2 and a third trigger signal terminal TRG3, an output terminal of the input selection sub-circuit being connected to the signal input terminal INPUT of the shift register unit, and configured to select a trigger signal to be provided to the signal input terminal according to voltage levels at first to third control terminals.

Optionally, as illustrated in FIG. 1 the shift register unit described above further comprises: a pull-down node control sub-circuit 105 connected to the pull-up node, a pull-down node PD and a second clock signal terminal CLK2, and configured to control a voltage level at the pull-down node according to a clock signal provided by the second clock signal terminal and a voltage level at the pull-up node.

Optionally, as illustrated in FIG. 1, the shift register unit described above further comprises: a pull-down sub-circuit 106 connected to the pull-down node, the pull-up node and the signal output terminal, and configured to pull down the pull-up node and the signal output terminal according to a voltage level at the pull-down node.

Optionally, as illustrated in FIG. 1, the shift register unit described above further comprises: an auxiliary control sub-circuit 107 connected to the pull-up node, the signal output terminal and the second clock signal terminal, and configured to assist in controlling voltage levels at the pull-up node and the signal output terminal according to a clock signal provided by the second clock signal terminal.

In the shift register unit provided above by the present disclosure, the input selection sub-circuit is adopted to select the trigger signal to be provided to the signal input terminal thereof, and thereby the number of pulse signal outputted by the shift register unit within one frame can be increased, accordingly, for various inversion modes, while driving a corresponding gate line, the other gate lines can be pre-charged.

Figure 2:
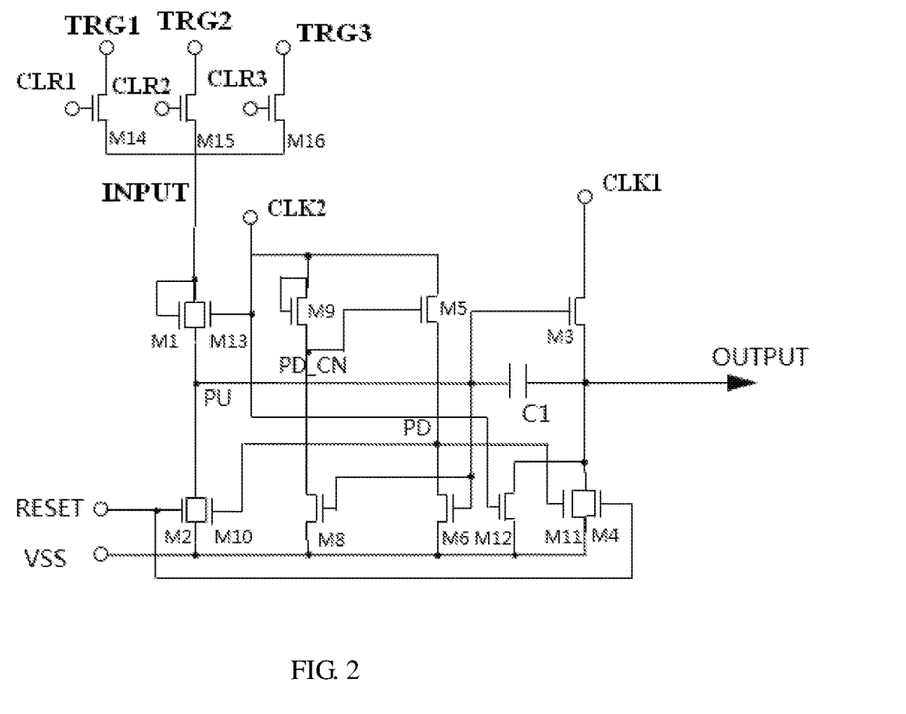
FIG. 2 illustrates a specific circuit structure of a shift register unit according to an embodiment of the present disclosure.

FIG. 2 illustrates a specific circuit structure of a shift register unit according to an embodiment of the present disclosure. As illustrated in FIG. 2, optionally, the input sub-circuit 101 comprises: an input transistor M1, a control electrode and a first electrode of the input transistor being connected to the signal input terminal INPUT, and a second electrode of the input transistor being connected to the pull-up node PU.

As illustrated in FIG. 2, optionally, the output sub-circuit 102 comprises: an output transistor M3, a control electrode of the output transistor being connected to the pull-up node, a first electrode of the output transistor being connected to the first clock signal terminal CLK1, and a second electrode of the output transistor being connected to the signal output terminal OUTPUT; and a capacitor C1, a first terminal of the capacitor being connected to the pull-up node, and a second terminal of the capacitor being connected to the signal output terminal.

As illustrated in FIG. 2, optionally, the reset sub-circuit 103 comprises: a first reset transistor M2, a control electrode of the first reset transistor being connected to the reset terminal RESET, a first electrode of the first reset transistor being connected to the pull-up node, and a second electrode of the first reset transistor being connected to a first power source terminal VSS; and a second reset transistor M4, a control electrode of the second reset transistor being connected to the reset terminal, a first electrode of the second reset transistor being connected to the signal output terminal, and a second electrode of the second reset transistor being connected to the first power source terminal VSS.

As illustrated in FIG. 2, optionally, the input selection sub-circuit 104 comprises: a first selection transistor M14, a control electrode of the first selection transistor being connected to a first control terminal CLR1, a first electrode of the first selection transistor being connected to the first trigger signal terminal TRG1, and the second electrode of the first selection transistor being connected to the output terminal of the input selection sub-circuit; a second selection transistor M15, a control electrode of the second selection transistor being connected to a second control terminal CLR2, a first electrode of the second selection transistor being connected to the second trigger signal terminal TRG2, and a second electrode of the second selection transistor being connected to the second electrode of the first selection transistor; and a third selection transistor M16, a control electrode of the third selection transistor being connected to a third control terminal CLR3, a first electrode of the third selection transistor being connected to the third trigger signal terminal TRG3, and a second electrode of the third selection transistor being connected to the second electrode of the first selection transistor.

As illustrated in FIG. 2, optionally, the pull-down node control sub-circuit 105 comprises: a first pull-down control transistor M9, a control electrode and a first electrode of the first pull-down control transistor being connected to the second clock signal terminal CLK2, and a second electrode of the first pull-down control transistor being connected to a pull-down control node PD_CN; a second pull-down control transistor M5, a control electrode of the second pull-down control transistor being connected to the pull-down control node PD_CN, a first electrode of the second pull-down control transistor being connected to the first electrode of the first pull-down control transistor M9, and a second electrode of the second pull-down control transistor being connected to the pull-down node PD; a third pull-down control transistor M8, a control electrode of the third pull-down control transistor being connected to the pull-up node, a first electrode of the third pull-down control transistor being connected to the pull-down control node, and a second electrode of the third pull-down control transistor being connected to a first power source terminal; and a fourth pull-down control transistor M6, a control electrode of the fourth pull-down control transistor being connected to the pull-up node, a first electrode of the fourth pull-down control transistor being connected to the pull-down node, and a second electrode of the fourth pull-down control transistor being connected to the first power source terminal.

As illustrated in FIG. 2, optionally, the pull-down sub-circuit 106 comprises: a first pull-down transistor M10, a control electrode of the first pull-down transistor being connected the pull-down node, a first electrode of the first pull-down transistor being connected to the pull-up node, and a second electrode of the first pull-down transistor being connected to a first power source terminal; and a second pull-down transistor M11, a control electrode of the second pull-down transistor being connected to the pull-down node, a first electrode of the second pull-down transistor being connected to the signal output terminal, and a second electrode of the second pull-down transistor being connected to the first power source terminal.

As illustrated in FIG. 2, optionally, the auxiliary control sub-circuit 107 comprises: a first auxiliary control transistor M13, a control electrode of the first auxiliary control transistor being connected to the second clock signal terminal, a first electrode of the first auxiliary control transistor being connected to the signal input terminal, and a second electrode of the first auxiliary control transistor being connected to the pull-up node; and a second auxiliary control transistor M12, a control electrode of the second auxiliary control transistor being connected to the second clock signal terminal, a first electrode of the second auxiliary control transistor being connected to the signal output terminal, and a second electrode of the second auxiliary control transistor being connected to the first power source terminal.

Optionally, in the shift register unit described above, each of the above-mentioned transistors can adopt a TFT transistor, wherein the control electrode of the transistor is a gate, the first electrode is a drain, and the second electrode is a source. In addition, it should be understood that, since a source and a drain of the transistors adopted here are symmetrical, the source and the drain of these transistors can be interchanged. In the embodiments of the present disclosure, in order to distinguish the two electrodes other than the gate, one electrode is referred to as a source, and the other is referred to as a drain. If a source is selected as a signal input terminal, then a drain serves as a signal output terminal, vice versa.

In addition, in FIG. 2, description is provided with all the TFTs being N-type TFTs as an example. However, as will be appreciated, some or all of the transistors can also adopt P-type TFTs, as long as control voltage levels at the gates thereof and the power source voltages provided thereto are adjusted accordingly, such implementations are also within the protection scope of the present disclosure.

In addition, in FIG. 2, although the first power source terminal is illustrated as being inputted with the low voltage level VSS in FIG. 2, in order to implement the principle of the present disclosure, the first power source terminal can be inputted with different low voltage levels, for example, low voltage levels VSS and VGL with different voltage values. For example, the low voltage level terminal connected to the transistor for pulling down the output terminal of the shift register unit can be inputted with the low voltage level VGL, and the low voltage level terminal connected to the transistor for pulling down the pull-up node of the shift register unit can be inputted with the low voltage level VSS, wherein the voltage level of VGL is lower than the voltage level of VSS. In this way, a gate-source potential of the output transistor of the shift register unit can be reversely biased when the pull-up node and the output terminal are both pulled down to the low voltage levels respectively, so that even if the output transistor adopts a depletion transistor, it can be guaranteed that the output transistor is completely turned off.

Figure 3:
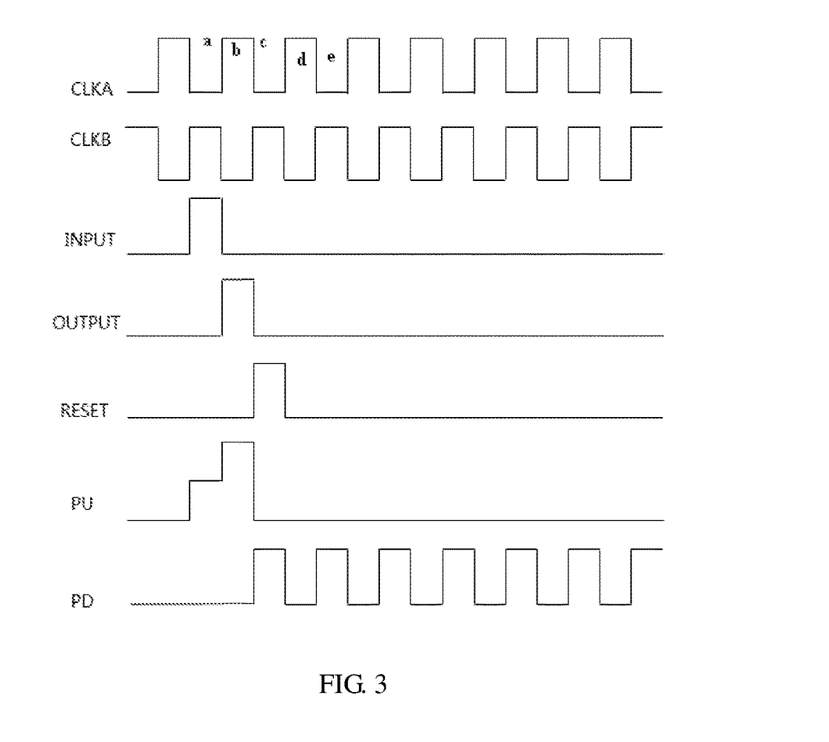
FIG. 3 illustrates a signal timing that can be used in the shift register unit illustrated in FIG. 2 according to an embodiment of the present disclosure.

Next, the operating principle of the shift register unit illustrated in FIG. 2 will be briefly described with reference to the signal timing illustrated in FIG. 3. Herein, when any one of the first to third control terminals CLR1 to CLR3 provides a high voltage level, the corresponding one of the first to third selection transistors will be turned on. For example, when the first control terminal CLR1 provides a high voltage level, the first selection transistor M14 whose control electrode is connected to the first control terminal will be turned on to provide the first trigger signal to the output terminal of the input selection sub-circuit, i.e., the signal input terminal INPUT. Next, with the first trigger signal being provided to the signal input terminal INPUT, the first clock signal CLKA being provided to the first clock signal terminal, and the second clock signal CLKB being provided to the second clock signal terminal as an example, operations of the shift register unit illustrated in FIG. 2 in the five periods a, b, c, d and e in the timing diagram illustrated in FIG. 3 are described. As an example, cycles of the first clock signal CLKA and the second clock signal CLKB are equal, their duty ratios both are 50%, and their phases have a difference of 180 degrees.

In the first period a, the first trigger signal received at the signal input terminal INPUT is at a high voltage level, the first clock signal CLKA is at a low voltage level, and the second clock signal CLKB is at a high voltage level; the transistor M1 is turned on, enabling the trigger signal of a high voltage level to charge the pull-up node PU; since the second clock signal CLKB is at a high voltage level, the transistor M13 is turned on, so as to accelerate the charging process of the pull-up node PU; thus, the pull-up node PU is charged to the first high voltage level, the output transistor M3 is turned on, and the clock signal CLKA of a low voltage level is outputted to the signal output terminal; the transistor M9 is turned on to charge the pull-down control node PD_CN, however, since the pull-up node PU is at a first high voltage level, the transistors M6 and M8 are turned on; in design of transistors, a size ratio of the transistors M8 and M9 can be configured in such a way that the voltage level at the pull-down control node PD_CN is pulled down to a low voltage level when M9 and M8 are both turned on; in this case, PD_CN is at a low voltage level, the transistor M5 maintains turned-off; since the transistor M6 is turned on, the voltage level at the pull-down node PD is pulled down to a low voltage level, and thus the transistors M10 and M11 are in a turned-off state in this period; since the CLKB is at a high voltage level, the transistor M12 is turned on, which can ensure that the output terminal of the shift register unit is pulled down to a low voltage level VSS;

In the second period b, the first clock signal CLKA is at a high voltage level, the second clock signal CLKB is at a low voltage level, the trigger signal inputted at the signal input terminal INPUT is at a low voltage level; the transistors M1, M13, M9, M5 and M12 are turned off; the output transistor M3 maintains turned-on, and the clock signal CLKA of a high voltage level is outputted as a pulse signal; due to bootstrap effect of the storage capacitor C1, the voltage level at the pull-up node PU further rises to a second high voltage level, enabling the output transistor M3 to be turned on more fully; since the voltage level at the pull-up node PU is raised relative to the voltage level in the period a, the transistors M8 and M6 are turned on more fully to further pull down the pull-down control node PD_CN and the pull-down node PD, respectively; since the pull-down node PD is at a low voltage level, the transistors M10 and M11 maintain turned-off, so as not to affect pulse signal output of the shift register unit;

In the third period c, the first clock signal CLKA is at a low voltage level, the second clock signal CLKB is at a high voltage level, the signal input terminal INPUT continues to be inputted with a low voltage level, and the reset terminal RESET is inputted with a high voltage level; since the reset terminal is inputted with a high voltage level, the transistors M2 and M4 are turned on, so as to pull down the pull-up node PU and the output terminal of the shift register unit to a low voltage level VSS; the transistor M1 is turned off, the transistor M13 is turned on, and a low voltage level is inputted to the pull-up node PU, so as to discharge the pull-up node PU; the pull-up node PU is discharged to a low voltage level, so that the transistor M3 is turned off; since the second clock signal CLKB is at a high voltage level, the transistor M12 is turned on, and the output terminal of the shift register unit is pulled down to a low voltage level VSS; the transistor M9 is turned on to charge the pull-down control node PD_CN, which in turn causes the transistor M5 to be turned on, thereby charging the pull-down node PD; since the pull-up node PU is at a low voltage level, the transistors M6 and M8 are turned off; the pull-down node PD is charged to a high voltage level, the transistors M10 and M11 are turned on, so as to pull down the pull-up node PU and the output terminal of the shift register unit to the low voltage level VSS, respectively;

In the fourth period d, the first clock signal CLKA is at a high voltage level, the second clock signal CLKB is at a low voltage level, the signal input terminal INPUT continues to be inputted with a low voltage level, and the reset terminal is inputted with a low voltage level; the transistors M1, M13, M2, M4, M9 and M12 are turned off; since the pull-up node PU maintains at a low voltage level, the transistors M6 and M8 maintain turned-off; since the transistors M8 and M9 are both turned off, a discharge path of the pull-down control node PD_CN is cut off, the pull-down control node PD_CN maintains the previous high voltage level, so that the transistor M5 maintains turned-on; since the second clock signal CLKB is at a low voltage level, the pull-down node PD is discharged.

In the fifth period e, the first clock signal CLK is at a low voltage level, the second clock signal CLKB is at a high voltage level, the input terminal INPUT continues to be inputted with a low voltage level, and the reset terminal is inputted with a low voltage level; the transistors M1, M2 and M4 are turned off; the transistor M13 is turned on, and the low voltage level is inputted to the pull-up node PU, so as to discharge the pull-up node PU, thereby ensuring that the transistor M3 is turned off; CLKB is at a high voltage level, and the transistor M12 is turned on, so as to pull down the output terminal of the shift register unit to a low voltage level VSS, thus eliminating the noise at the output terminal of the shift register unit; the transistor M9 is turned on to charge the pull-down control node PD_CN, so that the transistor M5 is turned on more fully, and the pull-down node PD is charged, causing the pull-down node PD to be changed into a high voltage level; since the pull-up node PU is discharged, the transistors M6 and M8 maintain turned-off; the high voltage level at the pull-down node PD causes the transistors M10 and M11 to be turned on, thus pulling down the pull-up node PU and the output terminal of the shift register unit to the low voltage level VSS, respectively, which eliminates the noise appearing at the pull-up node and the output terminal.

Thereafter, the shift register unit repeats the operations in periods d and e until a next active input signal arrives.

Although the operating principle of the shift register unit illustrated in FIG. 2 is described above with the first control terminal CLR1 being at a high voltage level as an example, based on the above principle, the case in which the second control terminal CLR2 or the third control terminal CLR3 is at a high voltage level is similar, details are not repeated herein.

Figure 4:
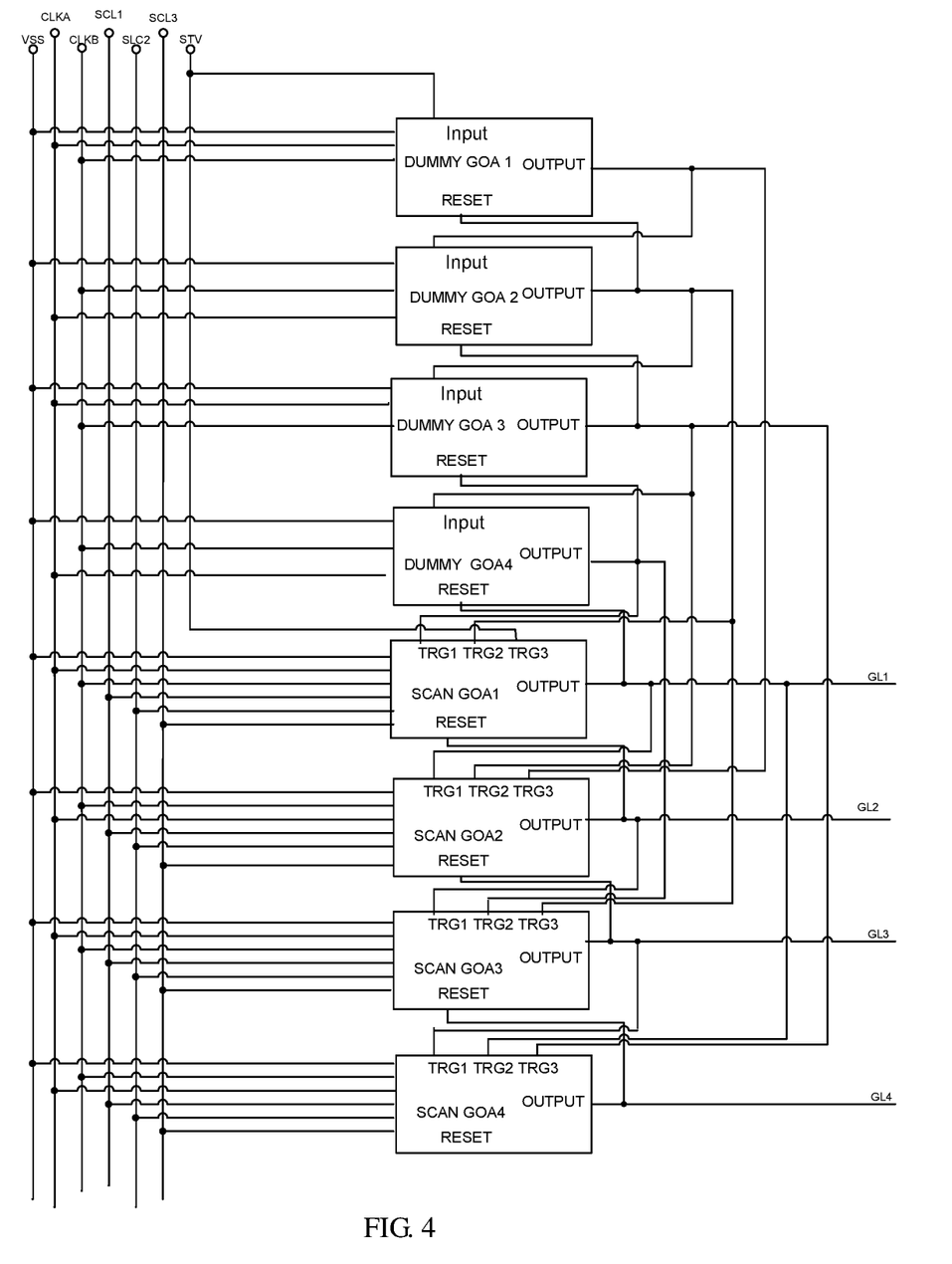
FIG. 4 illustrates a schematic structure of a gate line driving circuit comprising a plurality of stages of the shift register units illustrated in the above according to an embodiment of the present disclosure.

According to an embodiment of the present disclosure, there is provided a gate driving circuit comprising a plurality of stages of the shift register units (GOA units) described above. FIG. 4 illustrates a schematic structure of the gate driving circuit, wherein a signal output terminal of the shift register unit in each stage is connected to a gate line, and the shift register unit in each stage is configured as a Scanning GOA unit for driving a corresponding gate line. In addition, as illustrated in FIG. 4, the gate line driving circuit further comprises a plurality of stages of Dummy GOA units. Four stages of Dummy GOA units are illustrated in FIG. 4 as an example. However, it should be noted that, four stages of Dummy GOA units are merely an example according to an embodiment of the present disclosure, rather than a limitation on the principle of the present disclosure. In fact, under teaching of the principle of the present disclosure, it is also possible to use other numbers of plurality of stages of Dummy GOA units, as long as the signal connection relationships are adjusted accordingly, details are not described herein. In the gate line driving circuit illustrated in FIG. 4, a Dummy GOA unit is mainly used to generate a trigger signal and transfer the same to a Scanning GOA unit, and the Scanning GOA unit is used to drive a corresponding gate line and pre-charge some other gate lines.

Figure 5:
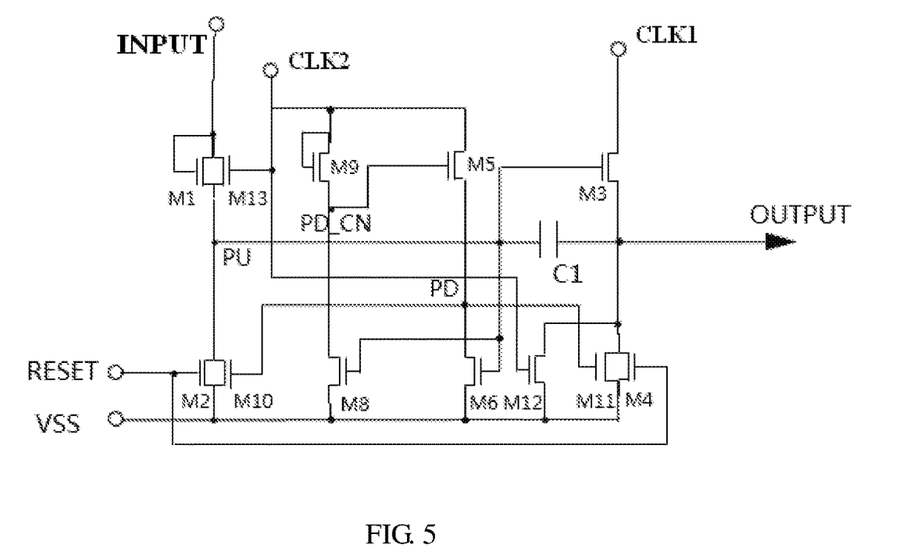
FIG. 5 illustrates a specific circuit structure of respective stages of dummy shift register units included in the gate line driving circuit according to an embodiment of the present disclosure.

Optionally, the internal circuit structure of the Dummy GOA unit is basically the same as that of the Scanning GOA unit, the main difference lies in that the Dummy GOA unit in each stage does not include the input selection sub-circuit descried above, and its signal input terminal INPUT is directly connected to the signal output terminal of the GOA unit in a previous stage. FIG. 5 schematically illustrates an internal structure of a Dummy GOA unit. To avoid repetition, the internal structure of the Dummy GOA unit will not be described in detail, reference can be made to structure of the Scanning GOA unit described above with reference to FIGS. 1 and 2, with ignoring the input selection sub-circuit contained therein.

As described above, the Dummy GOA unit in each stage is mainly responsible for signal activation, serving for signal activation of a subsequent GOA unit, not responsible for providing direct control over gate line scanning in an active area on the display panel.

As illustrated in FIG. 4, the four stages of Dummy GOA units are cascaded, the signal input terminal INPUT of Dummy GOA 1 in the first stage is inputted with the STV signal, and the signal output terminal of Dummy GOA 1 is connected to the signal input terminal of Dummy GOA 2; the reset terminal of Dummy GOA 1 is connected to the signal output terminal of Dummy GOA 2, the first clock signal terminal receives the first clock signal CLKA, the second clock signal terminal receives the second clock signal CLKB; the signal output terminal of Dummy GOA 2 is connected to the signal input terminal of Dummy GOA 3, and the reset terminal of Dummy GOA 2 is connected to the signal output terminal of Dummy GOA 3, except that the clock signals received by the first clock signal terminal and the second clock signal terminal of Dummy GOA 2 are exchanged with those received by the first clock signal terminal and the second clock signal terminal of Dummy GOA 1, that is, the first clock signal terminal of Dummy GOA 2 receives the second clock signal CLKB, and the second clock signal terminal of Dummy GOA 2 receives the first clock signal CLKA. The connection relationship between Dummy GOA 3 and Dummy GOA 4 can be analogized, only that the signal output terminal of Dummy GOA 4 which serves as the Dummy GOA unit in the last stage is connected to the first trigger signal terminal of the input selection sub-circuit of Scanning GOA unit in the first stage, and the reset terminal of Dummy GOA 4 is connected to the signal output terminal of Scanning GOAL in the first stage.

Signal connection relationship of the Scanning GOA unit in each stage will be described in detail below. For example, when the gate line driving circuit comprises N stages of Scanning GOA units, the first trigger signal terminal of Scanning GOA 1 unit in the first stage is connected to the signal output terminal of Dummy GOA unit in the last stage, that is, as illustrated in FIG. 4, being connected to the signal output terminal of Dummy GOA4 unit in the fourth stage, the second trigger signal terminal of Scanning GOA 1 unit in the first stage is connected to the signal output terminal of Dummy GOA2 unit in the second stage, and the third trigger signal terminal of Scanning GOA 1 unit in the first stage directly receives the STV signal; the first trigger signal terminal of Scanning GOA2 unit in the second stage is connected to the signal output terminal of Scanning GOAL in the first stage, the second trigger signal terminal of Scanning GOA2 in the second stage is connected to the signal output terminal of Dummy GOA3 unit in the third stage, and the third trigger signal terminal of Scanning GOA2 in the second stage is connected to the signal output terminal of Dummy GOA1 unit in the first stage; the first to third trigger signal terminals of Scanning GOA3 unit in the third stage are connected to the signal output terminals of GOA[2], D-GOA[4] and D-GOA[2] respectively, the first to third trigger signal terminals of Scanning GOA4 unit in the fourth stage are connected to the signal output terminals of GOA[3], GOA[1] and D-GOA [3] respectively, the first to third trigger signals of Scanning GOA 5 unit in the fifth stage are connected to the signal output terminals of GOA[4], GOA[2] and D-GOA[4] respectively, the first to third trigger signal terminals of Scanning GOA 6 unit in the sixth stage are connected to the signal output terminals of GOA[5], GOA[3] and GOA[1] respectively, . . . , the Scanning GOA units in subsequent stages can be analogized, that is, as for the GOA unit in a k-th stage, its first trigger signal terminal is connected to the signal output terminal of the GOA unit in a (k−1)-th stage, its second trigger signal terminal is connected to the signal output terminal of the GOA unit in a (k−3)-th stage, and its third trigger signal terminal is connected to the signal output terminal of the GOA unit in a (k−5)-th.

In addition, as illustrated in FIG. 4, the reset terminal of the GOA unit (including the Dummy GOA unit and the Scanning GOA unit) in each stage of the gate line driving circuit is connected to the signal output terminal of the GOA unit in a next stage; besides, the clock signals inputted to the first clock signal terminals and the second clock signal terminals of the GOA units in two adjacent stages are exchanged with each other. For Scanning GOA units in respective stages, their first to third control terminals CLR1-CLR3 are connected to the first to third control lines SCL1-SCL3, respectively, and their signal output terminals are connected to one gate line respectively so as to provide a scanning signal for the corresponding gate line.

In the gate line driving circuit provided above according to an embodiment of the present disclosure, among N stages of cascaded Dummy shift register units comprised therein, a signal input terminal of the Dummy shift register unit in a first stage is configured to receive a frame start signal STV, a signal output terminal of the Dummy shift register unit in an N-th stage is connected to an input selection sub-circuit of the Scanning shift register unit in a first stage.

Optionally, first to second trigger signal terminals of the input selection sub-circuit of the Scanning shift register unit in the first stage are connected to signal terminal output terminals of the Dummy shift register units in an N-th stage and an (N−2)-th stage, respectively, and a third trigger signal terminal of the input selection sub-circuit of the Scanning shift register unit in the first stage is connected to the frame start signal.

Optionally, first to third trigger signal terminals of an input selection sub-circuit of the Scanning shift register unit in a k-th stage are connected to signal output terminals of the shift register units in a (k−1)-th stage, a (k−3)-th stage, and a (k−5)-th stage, respectively.

Optionally, a reset terminal of the shift register unit in a j-th stage is connected to an output terminal of the shift register unit in a (j+1)-th stage, $1 \leq j \leq M+N-1$.

In the gate line driving circuit provided by the present disclosure, the input selection sub-circuit is incorporated in the Scanning GOA unit in each stage to select the trigger signal to be provided to the signal input terminal thereof, and thereby the number of pulse signal outputted by the Scanning GOA unit in each stage within one frame can be increased, accordingly, for various inversion modes, while driving a corresponding gate line, the other gate lines can be pre-charged.

Figure 6A:
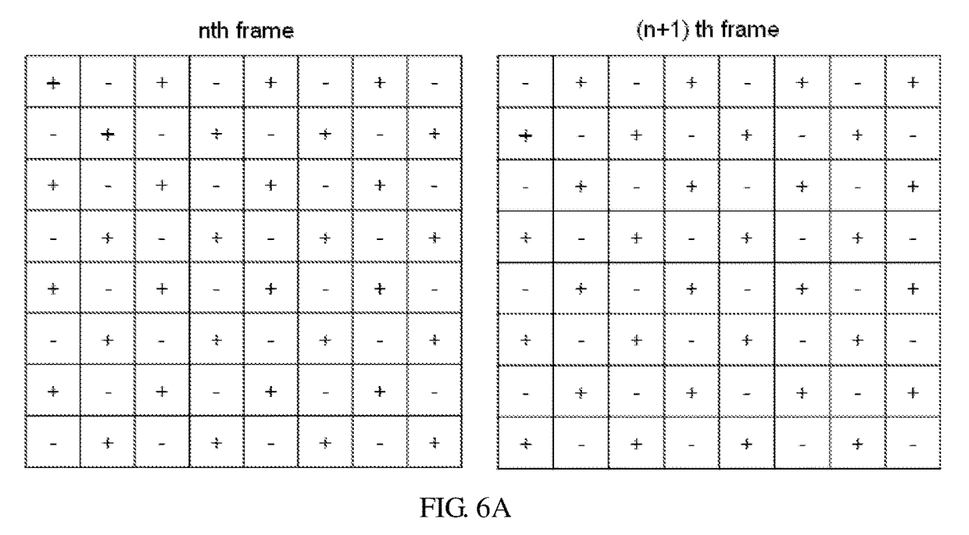
FIGS. 6A-6B each schematically illustrates polarity change of respective pixels in a case where a display panel adopts a 1 dot inversion mode and signal timing correspondingly adopted by the gate line driving circuit according to an embodiment of the present disclosure.

Next, the operating principle of the gate line driving circuit according to an embodiment of the present disclosure in a 1 dot inversion mode will be described below with reference to FIGS. 6A-6B. FIG. 6A schematically illustrates polarity change of respective pixels when the display panel adopts the 1 dot inversion mode, and FIG. 6B illustrates signal timing correspondingly adopted by the gate line driving circuit according to an embodiment of the present disclosure.

Figure 6B:
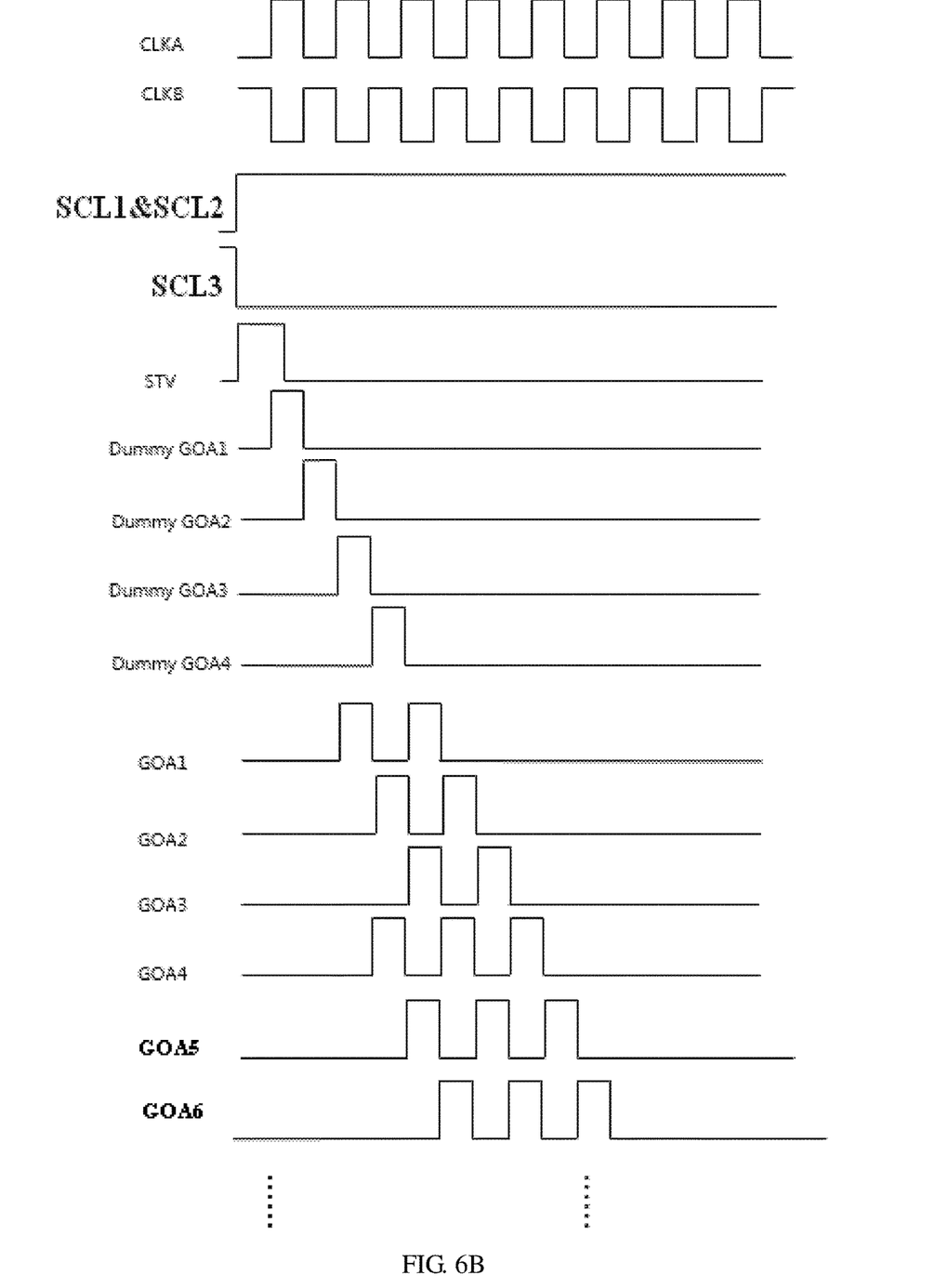

Specifically, when the inversion mode is 1 dot, polarity of the pixels of an n-th frame and an (n+1)-th frame is illustrated in FIG. 6A, and the corresponding signal timing is illustrated in FIG. 6B. The first and second control lines SCL1, SCL2 provide a high voltage level, and the third control line SCL3 provides a low voltage level, so that the first and second selection transistors of the input selection sub-circuit in the Scanning GOA unit in each stage are turned on, the third selection transistor thereof is turned off. Thus, the trigger signals from the first and second trigger signal terminals can be inputted to the signal input terminal, and the trigger signal from the third trigger signal terminal cannot be inputted to the signal input terminal. With reference to structure of the gate line driving circuit illustrated in FIG. 4, it can be known that, the four stages of Dummy GOA units are cascaded, when the Dummy GOA unit in the first stage receives the frame start signal STV, the signal output terminal of the Dummy GOA unit in the first stage will output a shifted pulse signal, correspondingly, the Dummy GOA units in the second to the fourth stages sequentially output the shifted pulse signal.

As described above, the trigger signals received at the first and second trigger signal terminals by the Scanning GOA unit in the first stage can be inputted to the signal input terminal thereof, the first and second trigger signal terminals of the Scanning GOA unit in the first stage are connected to the signal output terminals of the Dummy GOA units in the fourth stage and the second stage; thus, the Scanning GOA unit in the first stage will shift the pulse signals outputted by the Dummy GOA units in the fourth stage and the second stage and output the shifted pulse signals, as illustrated in FIG. 6B, the Scanning GOA unit in the first stage outputs two pulse signals.

Similarly, the trigger signals received at the first and second trigger signal terminals by the Scanning GOA unit in second stage can be inputted to the signal input terminal thereof, the first and second trigger signal terminals of the Scanning GOA unit in the second stage are connected to the Scanning GOA unit in the first stage and the Dummy GOA unit in the third stage respectively; thus, the Scanning GOA unit in the second stage will shift the pulse signals outputted by the Scanning GOA unit in the first stage and the Dummy GOA unit in the third stage and output the shifted pulse signals; as illustrated in FIG. 6B, it is noted that the timing of the pulse signal outputted by the Dummy GOA unit in the third stage is the same as the timing of the first pulse signal outputted by the Scanning GOA unit in first stage, so that the Scanning GOA unit in the second stage outputs two pulse signals.

Similarly, the first and second trigger signal terminals of the Scanning GOA unit in the third stage are connected to the Scanning GOA unit in the second stage and the Dummy GOA unit in the fourth stage respectively, so that the Scanning GOA unit in the third stage will shift the pulse signals outputted by the Scanning GOA in the second stage and the Dummy GOA unit in the fourth stage and output the shifted pulse signals; as illustrated in FIG. 6B, it is noted that the timing of the pulse signal outputted by the Dummy GOA unit in the fourth stage and the timing of the first pulse signal outputted by the Scanning GOA unit in the second stage are the same, so that the Scanning GOA unit in the third stage outputs two pulse signals.

Correspondingly, the first and second trigger signal terminals of the Scanning GOA unit in the fourth stage are connected to the Scanning GOA unit in the third stage and the Scanning GOA unit in the first stage respectively; thus, the Scanning GOA unit in the fourth stage will shift the pulse signals outputted by the Scanning GOA unit in the third stage and the Scanning GOA unit in the first stage and output the shifted pulse signals; as illustrated in FIG. 6B, it is noted that the timing of the second pulse signal outputted by the Scanning GOA unit in the first stage and the timing of the first pulse signal outputted by the Scanning GOA unit in the third stage are the same, so that the Scanning GOA unit in the fourth stage outputs three pulse signals.

Timing relationships of outputs of the respective Scanning GOA units in subsequent stages can be analogized.

It can be seen that, for polarity for driving pixels in the 1 dot inversion mode, when data is written on the pixels in the first row, the pixels in the third row start to be pre-charged, and polarity of pixels, which are located in the first column, of the first and third rows are made to be the same as "+"; when the data is written on the pixels in the second row, the pixels in the fourth row start to be pre-charged, and polarity of the pixels, which are located in the first column, of the second and fourth rows are made to be the same as "−", . . . , so that pre-charging with the same polarity is implemented in both the odd and even rows, and the pre-charging effect is achieved.

Figure 7A:
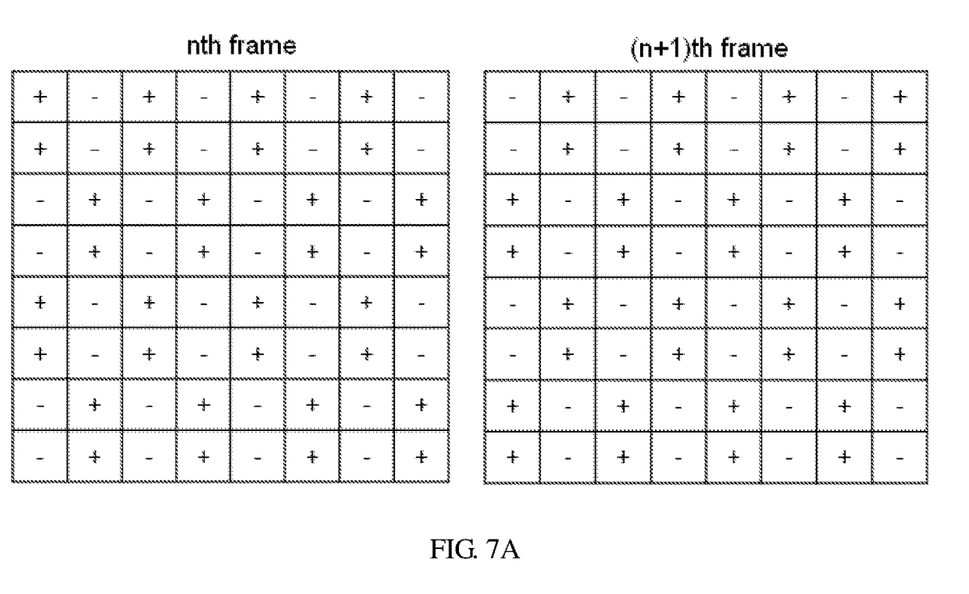
FIGS. 7A-7B each schematically illustrates polarity change of respective pixels in a case where a display panel adopts a 2 dot inversion mode and signal timing correspondingly adopted by the gate line driving circuit according to an embodiment of the present disclosure.

Next, the operating principle of the gate line driving circuit according to an embodiment of the present disclosure in a 2 dot inversion mode will be described below with reference to FIGS. 7A-7B. FIG. 7A schematically illustrates polarity change of respective pixels when the display panel adopts the 2 dot inversion mode, and FIG. 7B illustrates signal timing correspondingly adopted by the gate line driving circuit according to an embodiment of the present disclosure.

Figure 7B:
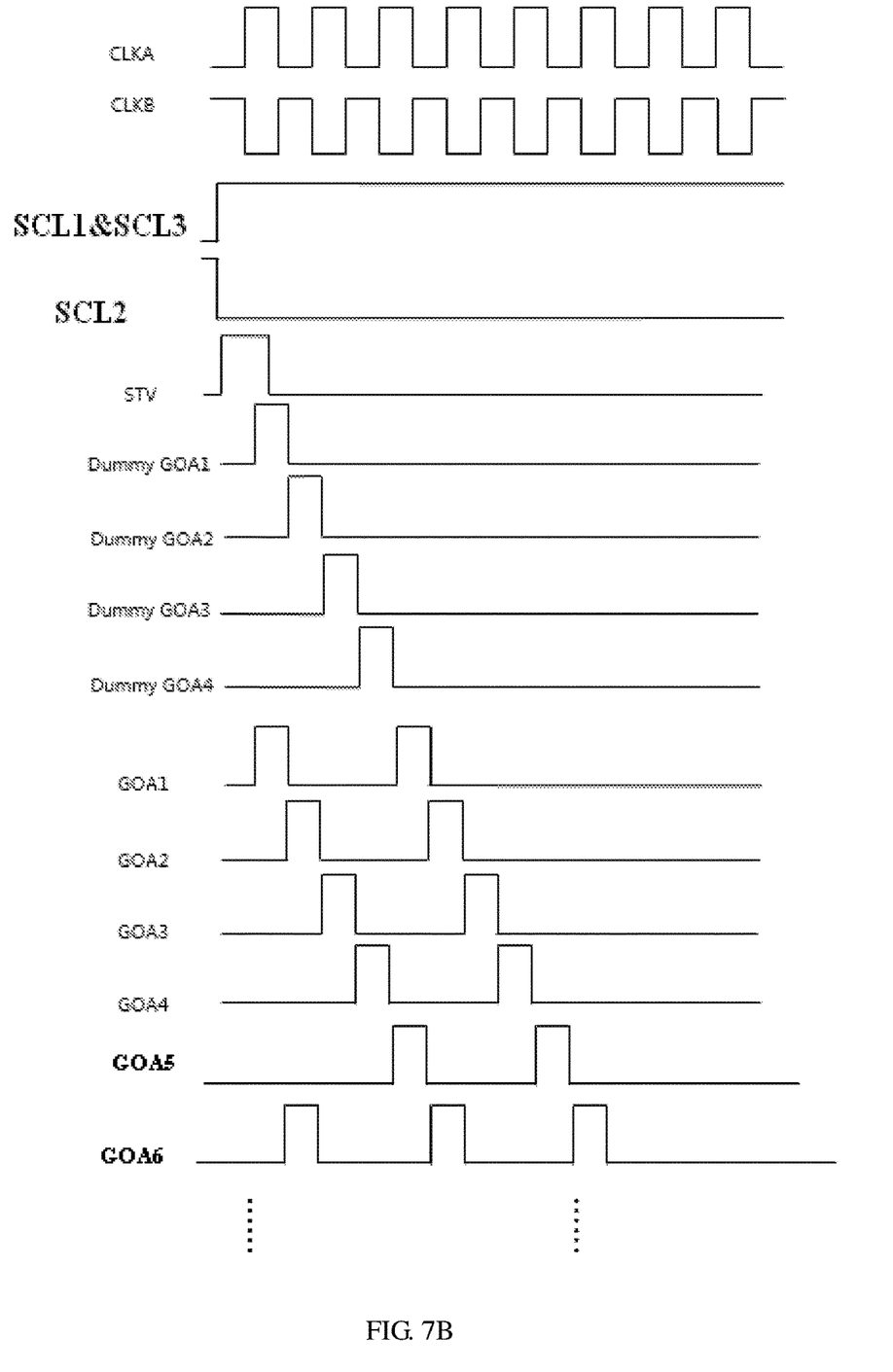

Specifically, when the inversion mode is 2 dot, polarity of the pixels of an n-th frame and an (n+1)-th frame is illustrated in FIG. 7A, and the corresponding signal timing is illustrated in FIG. 7B.

The first and third control lines SCL1, SCL3 provide a high voltage level, and the second control line SCL2 provides a low voltage level, so that the first and third selection transistors of the input selection sub-circuit in the Scanning GOA unit in each stage are turned on, the second selection transistor thereof is turned off. Thus, the trigger signals from the first and third trigger signal terminals can be inputted to the signal input terminal, and the trigger signal from the second trigger signal terminal cannot be inputted to the signal input terminal. With reference to structure of the gate line driving circuit illustrated in FIG. 4, it can be known that, the four stages of Dummy GOA units are cascaded, when the Dummy GOA unit in the first stage receives the frame start signal STV, the signal output terminal of the Dummy GOA unit in the first stage will output a shifted pulse signal, correspondingly, the Dummy GOA units in the second to the fourth stages sequentially output the shifted pulse signal.

As described above, the trigger signals received at the first and third trigger signal terminals by the Scanning GOA unit in the first stage can be inputted to the signal input terminal thereof, the first and third trigger signal terminals of the Scanning GOA unit in the first stage are connected to the signal output terminal of the Dummy GOA units in the fourth stage and the frame start signal STV; thus, the Scanning GOA unit in the first stage will shift the pulse signal outputted by the Dummy GOA units in the fourth stage and the frame start signal STV and output the shifted pulse signals, as illustrated in FIG. 7B, the Scanning GOA unit in the first stage outputs two pulse signals.

Similarly, the trigger signals received at the first and third trigger signal terminals by the Scanning GOA unit in second stage can be inputted to the signal input terminal thereof, the first and third trigger signal terminals of the Scanning GOA unit in the second stage are connected to the Scanning GOA unit in the first stage and the Dummy GOA unit in the first stage respectively; thus, the Scanning GOA unit in the second stage will shift the pulse signals outputted by the Scanning GOA unit in the first stage and the Dummy GOA unit in the first stage and output the shifted pulse signals; as illustrated in FIG. 7B, it is noted that the timing of the pulse signal outputted by the Dummy GOA unit in the first stage is the same as the timing of the first pulse signal outputted by the Scanning GOA unit in first stage, so that the Scanning GOA unit in the second stage outputs two pulse signals.

Similarly, the first and third trigger signal terminals of the Scanning GOA unit in the third stage are connected to the Scanning GOA unit in the second stage and the Dummy GOA unit in the second stage respectively, so that the Scanning GOA unit in the third stage will shift the pulse signals outputted by the Scanning GOA in the second stage and the Dummy GOA unit in the second stage and output the shifted pulse signals; as illustrated in FIG. 7B, it is noted that the timing of the pulse signal outputted by the Dummy GOA unit in the second stage and the timing of the first pulse signal outputted by the Scanning GOA unit in the second stage are the same, so that the Scanning GOA unit in the third stage outputs two pulse signals.

Correspondingly, the first and third trigger signal terminals of the Scanning GOA unit in the fourth stage are connected to the Scanning GOA unit in the third stage and the Dummy GOA unit in the third stage respectively; thus, the Scanning GOA unit in the fourth stage will shift the pulse signals outputted by the Scanning GOA unit in the third stage and the Dummy GOA unit in the third stage and output the shifted pulse signals; as illustrated in FIG. 7B, it is noted that the timing of the pulse signal outputted by the Dummy GOA unit in the third stage and the timing of the first pulse signal outputted by the Scanning GOA unit in the third stage are the same, so that the Scanning GOA unit in the fourth stage outputs two pulse signals.

Correspondingly, the first and third trigger signal terminals of the Scanning GOA unit in the fifth stage are connected to the Scanning GOA unit in the fourth stage and the Dummy GOA unit in the fourth stage respectively; thus, the Scanning GOA unit in the fifth stage will shift the pulse signals outputted by the Scanning GOA unit in the fourth stage and the Dummy GOA unit in the fourth stage and output the shifted pulse signals; as illustrated in FIG. 7B, it is noted that the timing of the pulse signal outputted by the Dummy GOA unit in the fourth stage and the timing of the first pulse signal outputted by the Scanning GOA unit in the fourth stage are the same, so that the Scanning GOA unit in the fifth stage outputs two pulse signals.

Correspondingly, the first and third trigger signal terminals of the Scanning GOA unit in the sixth stage are connected to the Scanning GOA unit in the fifth stage and the Scanning GOA unit in the first stage respectively; thus, the Scanning GOA unit in the sixth stage will shift the pulse signals outputted by the Scanning GOA unit in the fifth stage and the Scanning GOA unit in the first stage and output the shifted pulse signals; as illustrated in FIG. 7B, it is noted that the timing of the second pulse signal outputted by the Scanning GOA unit in the first stage and the timing of the first pulse signal outputted by the Scanning GOA unit in the fifth stage are the same, so that the Scanning GOA unit in the sixth stage outputs three pulse signals.

Timing relationships of outputs of the respective Scanning GOA units in subsequent stages can be analogized.

It can be seen that, for polarity for driving pixels in the 2 dot inversion mode, when data is written on the pixels in the first row, the pixels in the fifth row start to be pre-charged, and polarity of pixels, which are located in the first column, of the first and fifth rows are made to be the same as "+", and when data is written on the pixels in the second row, the pixels in the sixth row start to be pre-charged, and polarity of the pixels, which are located in the first column, of the second and sixth rows are made to be the same as "+"; when data is written on the pixels in the third row, the pixels in the seventh row start to be pre-charged, and polarity of pixels, which are located in the first column, of the third and seventh rows are made to be the same as "−", and when data is written on the pixels in the fourth row, the pixels in the eighth row start to be pre-charged, and polarity of the pixels, which are located in the first column, of the fourth and eighth rows are made to be the same as "−", . . . , so that the gate driving circuit according to the present disclosure realizes the pre-charging in the 2 dot inversion mode.

Figure 8:
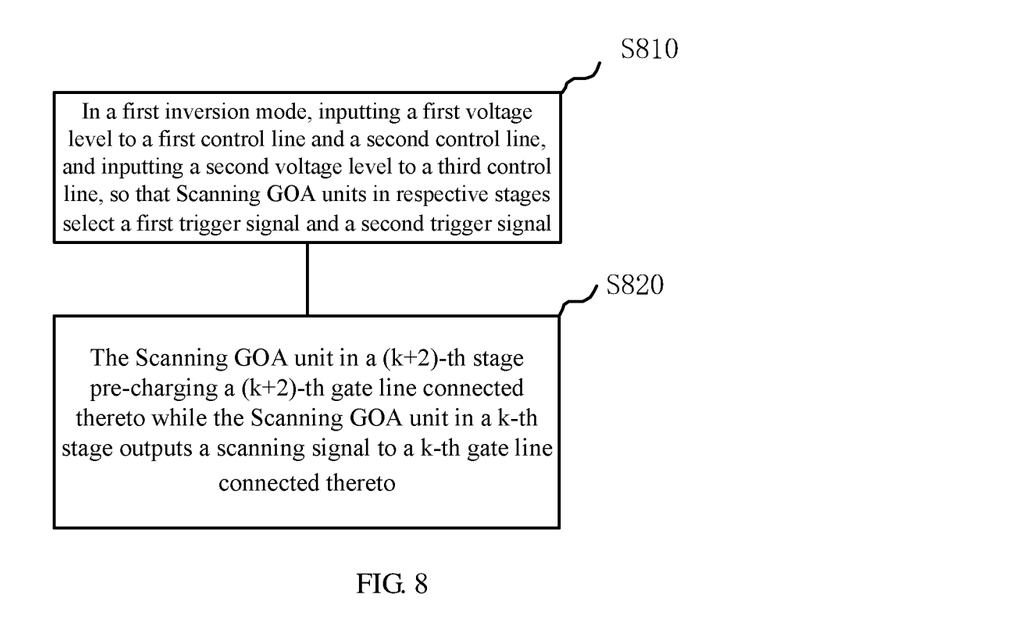
FIG. 8 illustrates a schematic flow of a method applied to the gate line driving circuit illustrated in FIG. 4 according to an embodiment of the present disclosure.

According to another aspect of the present disclosure, there is further provided a method for controlling the gate line driving circuit illustrated in FIG. 4, as illustrated in FIG. 8, the method mainly comprises: in a first inversion mode, inputting a first voltage level to a first control line and a second control line, and inputting a second voltage level to a third control line, so that Scanning GOA units in respective stages select a first trigger signal and a second trigger signal; wherein the Scanning GOA unit in a (k+2)-th stage pre-charges a (k+2)-th gate line connected thereto while the Scanning GOA unit in a k-th stage outputs a scanning signal to a k-th gate line connected thereto.

Figure 9:
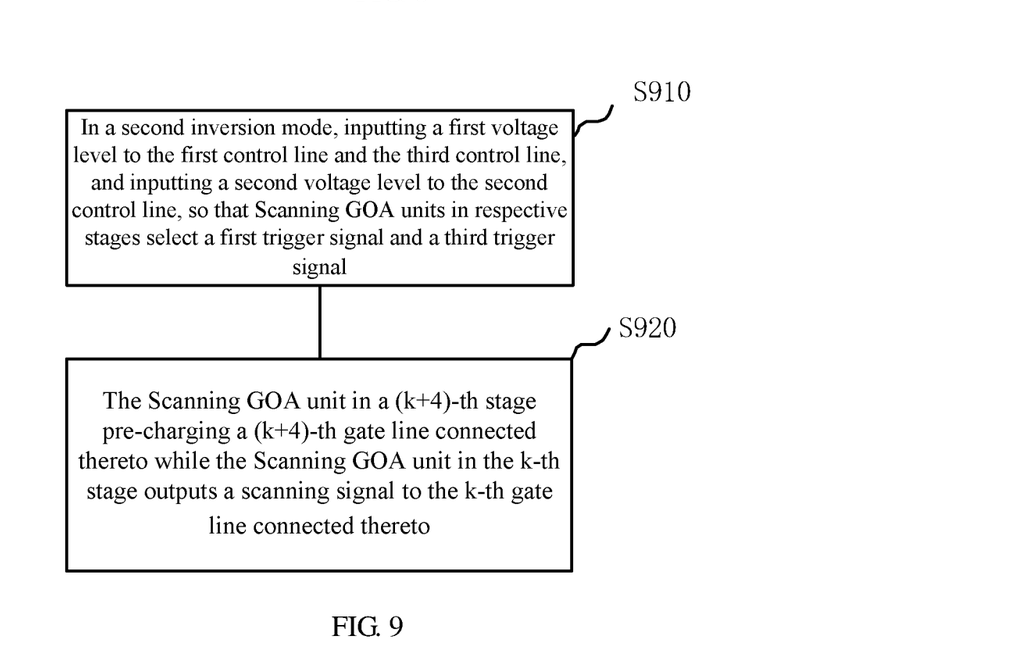
FIG. 9 illustrates a schematic flow of another method applied to the gate line driving circuit illustrated in FIG. 4 according to an embodiment of the present disclosure.

Optionally, as illustrated in FIG. 9, the method further comprises: in a second inversion mode, inputting a first voltage level to the first control line and the third control line, and inputting a second voltage level to the second control line, so that Scanning GOA units in respective stages select a first trigger signal and a third trigger signal; wherein the Scanning GOA unit in a (k+4)-th stage pre-charges a (k+4)-th gate line connected thereto while the Scanning GOA unit in the k-th stage outputs a scanning signal to the k-th gate line connected thereto.

Optionally, the first voltage level is a high voltage level, and the second voltage level is a low voltage level.

In the gate line driving circuit provided according to the present disclosure, the input selection sub-circuit set in the Scanning GOA unit in each stage can be controlled through corresponding control lines to select the trigger signals to be provided to the signal input terminal thereof, and thereby the number of pulse signal outputted by the Scanning GOA unit in each stage within one frame can be increased, so that for various inversion modes, while driving a corresponding gate line, the other gate lines can be pre-charged.

The above described merely are specific implementations of the present disclosure, but the protection scope of the present disclosure is not limited thereto, modification and replacements easily conceivable for those skilled in the art within the technical range revealed by the present disclosure all fall into the protection scope of the present disclosure. Therefore, the protection scope of the present disclosure is based on the protection scope of the claims.

The present application claims priority of the Chinese Patent Application No. 201710237053.9 filed on Apr. 12, 2017, the entire disclosure of which is hereby incorporated in full text by reference as part of the present application.

What is claimed is:

1. A shift register unit, comprising:
an input sub-circuit connected between a signal input terminal and a pull-up node, and configured to provide a trigger signal received by the signal input terminal to the pull-up node;
an output sub-circuit connected between the pull-up node, a signal output terminal, and a first clock signal terminal, and configured to output, to the signal output terminal, a pulse signal provided by the first clock signal terminal as a driving signal for scanning a gate line under control of the pull-up node;
a reset sub-circuit connected between a reset terminal, and the pull-up node and the signal output terminal, and configured to reset the pull-up node and the signal output terminal under control of the reset terminal; and
an input selection sub-circuit, an input terminal of the input selection sub-circuit being connected to a first trigger signal terminal, a second trigger signal terminal and a third trigger signal terminal, an output terminal of the input selection sub-circuit being connected to the signal input terminal of the shift register unit, and the input selection sub-circuit being configured to select a trigger signal to be provided to the signal input terminal according to voltage levels at a first control terminal, a second control terminal, and a third control terminal,
wherein the input selection sub-circuit comprises:
a first selection transistor having a control electrode connected to the first control terminal, a first electrode connected to the first trigger signal terminal, and a second electrode connected to the output terminal of the input selection sub-circuit;
a second selection transistor having a control electrode connected to the second control terminal, a first electrode connected to the second trigger signal terminal, and a second electrode connected to the second electrode of the first selection transistor; and
a third selection transistor having a control electrode connected to the third control terminal, a first electrode connected to the third trigger signal terminal, and a second electrode connected to the second electrode of the first selection transistor,
wherein in a first inversion mode, the input selection sub-circuit is configured to provide a first trigger signal and a second trigger signal, and
in a second inversion mode, the input selection sub-circuit is configured to provide the first trigger signal and a third trigger signal.

2. The shift register unit according to claim 1, further comprising:
a pull-down node control sub-circuit connected to the pull-up node, a pull-down node, and a second clock signal terminal, and configured to control a voltage level at the pull-down node according to a clock signal provided by the second clock signal terminal and a voltage level at the pull-up node.

3. The shift register unit according to claim 2, further comprising:
a pull-down sub-circuit connected to the pull-down node, the pull-up node, and the signal output terminal, and configured to pull down the pull-up node and the signal output terminal according to a voltage level at the pull-down node.

4. The shift register unit according to claim 2, further comprising:
an auxiliary control sub-circuit connected to the pull-up node, the signal output terminal, and the second clock signal terminal, and configured to assist in controlling voltage levels at the pull-up node and the signal output terminal according to a clock signal provided by the second clock signal terminal.

5. The shift register unit according to claim 1, wherein
the input sub-circuit comprises an input transistor having a control electrode and a first electrode connected to the signal input terminal, and a second electrode connected to the pull-up node;
the output sub-circuit comprises: an output transistor having a control electrode connected to the pull-up node, a first electrode connected to the first clock signal terminal, and a second electrode connected to the signal output terminal; and a capacitor having a first terminal connected to the pull-up node, and a second terminal connected to the signal output terminal; and
the reset sub-circuit comprises: a first reset transistor having a control electrode connected to the reset terminal, a first electrode connected to the pull-up node, and a second electrode connected to a first power source terminal; and a second reset transistor having a control electrode connected to the reset terminal, a first electrode connected to the signal output terminal, and a second electrode connected to the first power source terminal.

6. The shift register unit according to claim 2, wherein the pull-down node control sub-circuit comprises:
a first pull-down control transistor having a control electrode and a first electrode connected to the second clock signal terminal, and a second electrode connected to a pull-down control node;
a second pull-down control transistor having a control electrode connected to the pull-down control node, a first electrode connected to the first electrode of the first pull-down control transistor, and a second electrode connected to the pull-down node;
a third pull-down control transistor having a control electrode connected to the pull-up node, a first electrode connected to the pull-down control node, and a second electrode connected to a first power source terminal; and
a fourth pull-down control transistor having a control electrode connected to the pull-up node, a first electrode connected to the pull-down node, and a second electrode connected to the first power source terminal.

7. The shift register unit according to claim 3, wherein the pull-down sub-circuit comprises:
a first pull-down transistor having a control electrode connected the pull-down node, a first electrode connected to the pull-up node, and a second electrode connected to a first power source terminal; and
a second pull-down transistor having a control electrode connected to the pull-down node, a first electrode connected to the signal output terminal, and a second electrode connected to the first power source terminal.

8. The shift register unit according to claim 4, wherein the auxiliary control sub-circuit comprises:
a first auxiliary control transistor having a control electrode connected to the second clock signal terminal, a first electrode connected to the signal input terminal, and a second electrode connected to the pull-up node; and
a second auxiliary control transistor having a control electrode connected to the second clock signal terminal, a first electrode connected to the signal output terminal, and a second electrode connected to a first power source terminal.

9. A gate line driving circuit, comprising M stages of the shift register unit according to claim 1, wherein a signal output terminal of the shift register unit in each stage is connected to a gate line, and the shift register unit in each stage is configured as a Scanning shift register unit for driving a corresponding gate line; and
a signal output terminal of a Scanning shift register unit in an m-th stage is connected to input selection sub-circuits of Scanning shift register units in an (m+1)-th stage, an (m+3)-th stage, and an (m+5)-th stage, where 1≤m≤M−5.

10. The gate line driving circuit according to claim 9, further comprising N stages of cascaded dummy shift register units, wherein a signal input terminal of a dummy shift register unit in a first stage is configured to receive a frame start signal STV, and signal output terminal of a dummy shift register unit in an N-th stage is connected to an input selection sub-circuit of a Scanning shift register unit in a first stage.

11. The gate line driving circuit according to claim 10, wherein a first trigger signal terminal and a second trigger signal terminal of the input selection sub-circuit of the Scanning shift register unit in the first stage are connected to signal terminal output terminals of the dummy shift register units in the N-th stage and an (N−2)-th stage, respectively, and a third trigger signal terminal of the input selection sub-circuit of the Scanning shift register unit in the first stage is connected to the frame start signal; and
a first trigger signal terminal, a second trigger signal terminal, and a third trigger signal terminal of an input selection sub-circuit of a Scanning shift register unit in a k-th stage are connected to signal output terminals of shift register units in a (k−1)-th stage, a (k−3)-th stage, and a (k−5)-th stage, respectively.

12. The gate line driving circuit according to claim 10, wherein a reset terminal of the shift register unit in a j-th stage is connected to an output terminal of the shift register unit in a (j+1)-th stage, where 1≤j≤M+N−1.

13. A driving method applied to the gate line driving circuit according to claim 9, the driving method comprising:
in the first inversion mode, inputting a first voltage level to the first control terminal and the second control terminal, and inputting a second voltage level to the third control terminal, so that Scanning GOA units in respective stages select the first trigger signal and the second trigger signal, wherein a Scanning GOA unit in a (k+2)-th stage pre-charges a (k+2)-th gate line connected thereto while a Scanning GOA unit in a k-th stage outputs a scanning signal to a k-th gate line connected thereto.

14. The driving method according to claim 13, further comprising:
in the second inversion mode, inputting the first voltage level to the first control terminal the third control terminal, and inputting the second voltage level to the second control terminal, so that Scanning GOA units in respective stages select the first trigger signal and the third trigger signal, wherein the Scanning GOA unit in a (k+4)-th stage pre-charges a (k+4)-th gate line connected thereto while the Scanning GOA unit in the k-th stage outputs the scanning signal to the k-th gate line connected thereto.

15. The gate line driving circuit according to claim 9, wherein the shift register unit further comprises:
a pull-down node control sub-circuit connected to the pull-up node, a pull-down node, and a second clock signal terminal, and configured to control a voltage level at the pull-down node according to a clock signal provided by the second clock signal terminal and a voltage level at the pull-up node.

16. The gate line driving circuit according to claim 15, wherein the shift register unit further comprises:
a pull-down sub-circuit connected to the pull-down node, the pull-up node and the signal output terminal, and configured to pull down the pull-up node and the signal output terminal according to a voltage level at the pull-down node.

17. The gate line driving circuit according to claim 15, wherein the shift register unit further comprises:
an auxiliary control sub-circuit connected to the pull-up node, the signal output terminal, and the second clock signal terminal, and configured to assist in controlling voltage levels at the pull-up node and the signal output terminal according to a clock signal provided by the second clock signal terminal.

18. The gate line driving circuit according to claim 9, wherein
the input sub-circuit comprises an input transistor having a control electrode and a first electrode connected to the signal input terminal, and a second electrode connected to the pull-up node;
the output sub-circuit comprises: an output transistor having a control electrode connected to the pull-up node, a first electrode connected to the first clock signal terminal, and a second electrode connected to the signal output terminal; and a capacitor having a first terminal connected to the pull-up node, and a second terminal connected to the signal output terminal; and
the reset sub-circuit comprises: a first reset transistor having a control electrode connected to the reset terminal, a first electrode connected to the pull-up node, and a second electrode connected to a first power source terminal; and a second reset transistor having a control electrode connected to the reset terminal, a first electrode connected to the signal output terminal, and a second electrode connected to the first power source terminal.

* * * * *